United States Patent
Hirano et al.

(10) Patent No.: US 11,694,117 B2
(45) Date of Patent: Jul. 4, 2023

(54) WAVEFORM GENERATION IDENTIFICATION METHOD AND COMPUTER-READABLE MEDIUM

(71) Applicants: Ryoji Hirano, Osaka (JP); Masayuki Hirata, Osaka (JP); Otoichi Nakata, Kanagawa (JP)

(72) Inventors: Ryoji Hirano, Osaka (JP); Masayuki Hirata, Osaka (JP); Otoichi Nakata, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 17/083,350

(22) Filed: Oct. 29, 2020

(65) Prior Publication Data

US 2021/0132125 A1    May 6, 2021

(30) Foreign Application Priority Data

Oct. 30, 2019  (JP) .................... 2019-197920
Aug. 19, 2020  (JP) .................... 2020-138813

(51) Int. Cl.
*G06K 9/00* (2022.01)
*G06N 20/00* (2019.01)
*G01R 23/00* (2006.01)

(52) U.S. Cl.
CPC .......... *G06N 20/00* (2019.01); *G06F 2218/12* (2023.01); *G06F 2218/14* (2023.01)

(58) Field of Classification Search
CPC ....... G01R 23/005; A61B 5/4094; A61B 5/72; A61B 2576/026; G06K 9/00516; G06K 9/0053; G06K 9/00536; G06K 9/00543
See application file for complete search history.

(56) References Cited

U.S. PATENT DOCUMENTS

| | | | |
|---|---|---|---|
| 2005/0007091 A1* | 1/2005 | Makeig | G06K 9/624 324/76.13 |
| 2014/0025715 A1* | 1/2014 | Yang | G06N 3/049 708/131 |
| 2017/0164852 A1* | 6/2017 | Jackson | A61B 5/24 |
| 2018/0140256 A1* | 5/2018 | Govindjee | A61B 5/742 |
| 2018/0268588 A1 | 9/2018 | Shinohara et al. | |
| 2019/0087996 A1 | 3/2019 | Shinohara et al. | |
| 2020/0170542 A1* | 6/2020 | Waziri | A61B 5/7435 |

FOREIGN PATENT DOCUMENTS

| | | |
|---|---|---|
| JP | 3107020 | 11/2000 |
| JP | 2018-089336 | 6/2018 |

* cited by examiner

*Primary Examiner* — Catherine T. Rastovski
(74) *Attorney, Agent, or Firm* — Xsensus LLP

(57) ABSTRACT

A waveform generation identification method includes: comparing individual waveform data obtained by a plurality of sensors, with at least one piece of characteristic waveform information; determining appearance probability of characteristic waveform information in at least a certain section of the waveform data, based on a degree of correlation between a peak section of the waveform data and the characteristic waveform information; and identifying a time when a section matching with the characteristic waveform information appears and a concerned sensor, based on the appearance probability.

14 Claims, 8 Drawing Sheets

WAVEFORM GENERATION IDENTIFICATION METHOD AND COMPUTER-READABLE MEDIUM

CROSS-REFERENCE TO RELATED APPLICATIONS

The present application claims priority under 35 U.S.C. § 119 to Japanese Patent Application No. 2019-197920, filed on Oct. 30, 2019, and Japanese Patent Application No. 2020-138813, filed on Aug. 19, 2020. The contents of the foregoing are incorporated herein by reference in their entireties.

BACKGROUND OF THE INVENTION

1. Field of the Invention

The present invention relates to a waveform generation identification method and a computer-readable medium.

2. Description of the Related Art

Conventionally, in a magneto-encephalograph or in the analysis of a magneto-encephalograph, analyzing the characteristic waveforms is an extremely significant factor. However, with the advancement in the technology, the sampling frequency and the number of sensors at the time of measurement are on the increase, thereby resulting in a trend toward an increase in the time required to visually search for the waveforms.

For example, during the bedside diagnosis of epilepsy using a magneto-encephalograph, the localization of the epilepsy lesion is evaluated using a method called an equivalent current dipole method. In the equivalent current dipole method, the current source (dipole) that generates the magnetic field measured on the scalp is estimated. In order to perform dipole estimation, from the temporal sequence of a plurality of sensors, the time (origin) when characteristic waveform information (IED: Interictal Epileptiform Discharge) is generated and the sensor at which such waveform information appears need to be narrowed down.

Under present circumstances, a doctor manually searches the IED and determines the origin. However, since the data of a magneto-encephalograph is enormous in volume, it is a difficult task to manually extract the sensors and the time of the IED with accuracy for each individual IED.

In that regard, in Japanese Patent No. 3107020, a technology is disclosed in which, with the aim of accurately detecting characteristic waves, time-series data of brain electromagnetic waves in one or more sensors is subjected to wavelet transform and characteristic waveforms including the IED are detected.

However, according to the technology disclosed in Japanese Patent No. 3107020, there is an issue of being unable to determine the time of the IED and narrow down the sensors in an appropriate manner in the case of implementing the equivalent current dipole method.

SUMMARY OF THE INVENTION

According to an aspect of the present invention, a waveform generation identification method includes: comparing individual waveform data obtained by a plurality of sensors, with at least one piece of characteristic waveform information; determining appearance probability of characteristic waveform information in at least a certain section of the waveform data, based on a degree of correlation between a peak section of the waveform data and the characteristic waveform information; and identifying a time when a section matching with the characteristic waveform information appears and a concerned sensor, based on the appearance probability.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
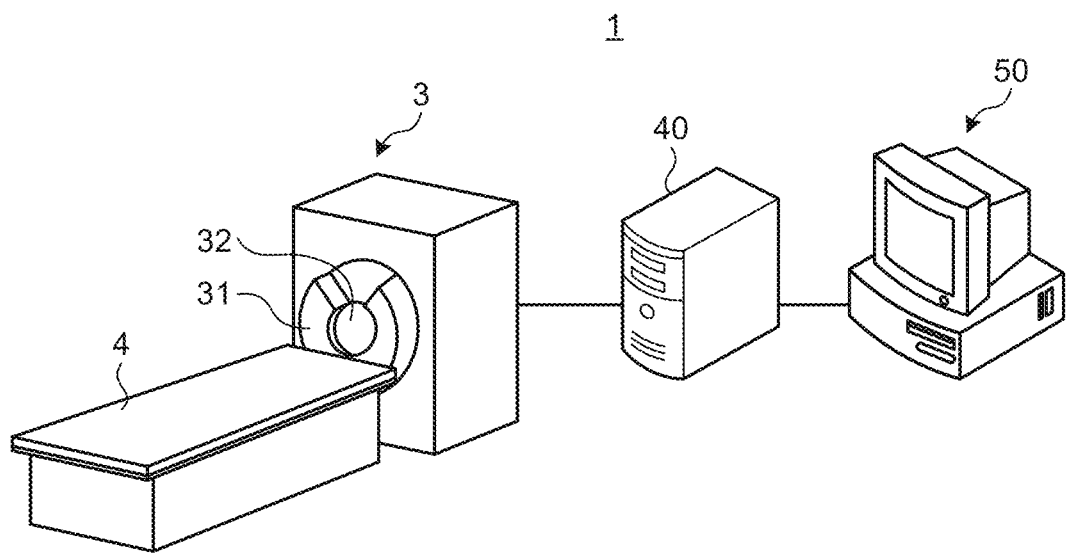
FIG. 1 is a schematic diagram illustrating a configuration of a biosignal measurement system according to an embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An embodiment has an object to enable to determine more accurately the time at which characteristic waveform information appears and extract the sensor.

An exemplary embodiment of a waveform generation identification method and a computer-readable medium is described below in detail with reference to the accompanying drawings. However, the present invention is not limited by the embodiment described below and is to be construed as embodying all modifications such as other embodiments, additions, alternative constructions, and deletions that may occur to one skilled in the art that fairly fall within the basic teaching herein set forth.

In the present embodiment, at the time of calculating a probability map of the interictal epileptiform discharge (IED), the following features are available. That is, as a result of using an IED probability map, it becomes possible to detect the time of the origin of the IED and to select the sensors as required in the equivalent current dipole method.

When a doctor performs analysis, it is ideal to analyze the origin of the IED using the equivalent current dipole method. However, since it is known that the origin has a low S/N (signal-to-noise) ratio; in practice, the time of the IED is determined in between the origin to the peak of the IED. In the present embodiment, the analysis is performed without restricting the analysis to the origin.

Overview of Biosignal Measurement System

FIG. 1 is a schematic diagram illustrating a configuration of a biosignal measurement system according to the present embodiment. Thus, with reference to FIG. 1, an overview of a biosignal measurement system 1 according to the present embodiment is explained below.

The biosignal measurement system 1 is a system for measuring and displaying a plurality of types of biosignals (for example, magneto-encephalography (MEG) signals and electro-encephalography (EEG) signals) coming from a particular source (body region) of the subject being tested. Meanwhile, in the present invention, the biosignals to be measured are not limited to magneto-encephalography (MEG) signals and electro-encephalography (EEG) signals. For example, electrical signals generated according to the cardiac activity (i.e., electrical signals expressible as an electrocardiogram) can also be measured.

As illustrated in FIG. 1, the biosignal measurement system 1 includes a measurement device 3 that measures one or more types of biosignals of the subject being tested; a server 40 that records one or more types of biosignals measured by the measurement device 3; and an information processing device 50 that represents a biosignal display device and that analyzes one or more types of biosignals recorded in the server 40. The measurement device 3 is a magneto-encephalograph that collects the measured values of, for example, the cerebral magnetic field and the timing of applying stimulation. Meanwhile, in FIG. 1, although the server 40 and the information processing device 50 are illustrated to be separate devices; for example, at least some of the functions of the server 40 can be incorporated in the information processing device 50.

In the example illustrated in FIG. 1, the subject being tested (the subject being measured) lies down in a supine position on a measurement table 4 with electrodes (or sensors) for electro-encephalography measurement attached to his or her head region; and then puts the head region in a recessed portion 32 of a Dewar flask 31 of the measurement device 3. The Dewar flask 31 is a holder made of liquid helium and having a cryogenic environment. On the inside of the recessed portion 32 of the Dewar flask 31, a number of magnetic sensors meant for electro-encephalography are installed. The measurement device 3 collects electro-encephalography signals from the electrodes, collects magneto-encephalography signals from the magnetic sensors, and outputs data containing the electro-encephalography signals and the magneto-encephalography signals (hereinafter, called "measurement data") to the server 40. The measurement data output to the server 40 is read and displayed in the information processing device 50 for analysis purposes. Generally, the Dewar flask 31, which has built-in magnetic sensors, and the measurement table 4 are installed inside a magnetic shield room. However, in FIG. 1, as a matter of convenience, the magnetic shield room is not illustrated.

The information processing device 50 displays waveform data of the magneto-encephalography signals, which are obtained from a plurality of magnetic sensors, and waveform data of the electro-encephalography signals, which are obtained from a plurality of electrodes, in a synchronized manner on the same time axis. The electro-encephalography signals are signals in which the electrical activity of the nerve cells (the flow of ionic charge generated due to the dendritic outgrowth of neurons at the time of synapse transmission) is expressed as voltage values among the electrodes. The magneto-encephalography signals are signals that represent the minute fluctuation in electrical fields that is attributed to the electrical activity of the brain. The cerebral magnetic field is detected by a high-sensitivity SQUID sensor (SQUID stands for Superconducting Quantum Interference Device). Herein, the electro-encephalography signals and the magneto-encephalography signals are examples of "biosignals".

Figure 2:
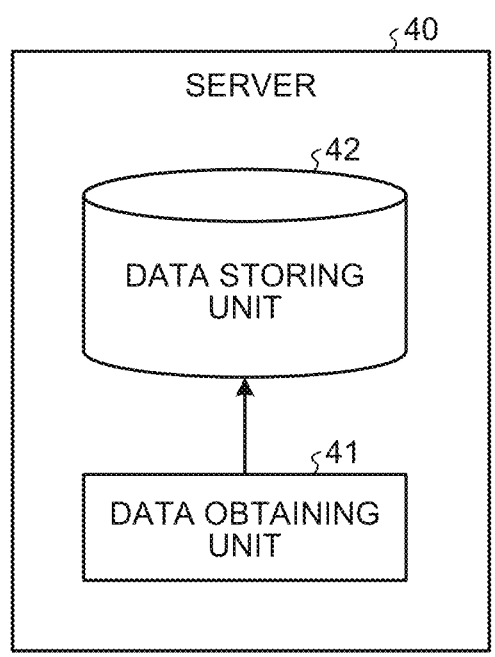
FIG. 2 is a block diagram that schematically illustrates a functional configuration of a server.

FIG. 2 is a block diagram that schematically illustrates a functional configuration of the server 40. As illustrated in FIG. 2, the server 40 includes a data obtaining unit 41 and a data storing unit 42.

The data obtaining unit 41 periodically obtains measurement data from the measurement device 3. The measurement data represents individual waveform data measured by a plurality of magnetic sensors in the Dewar flask 31 of the measurement device 3.

The data storing unit 42 is used to store the measurement data obtained from the measurement device 3.

Hardware Configuration of Information Processing Device

Figure 3:
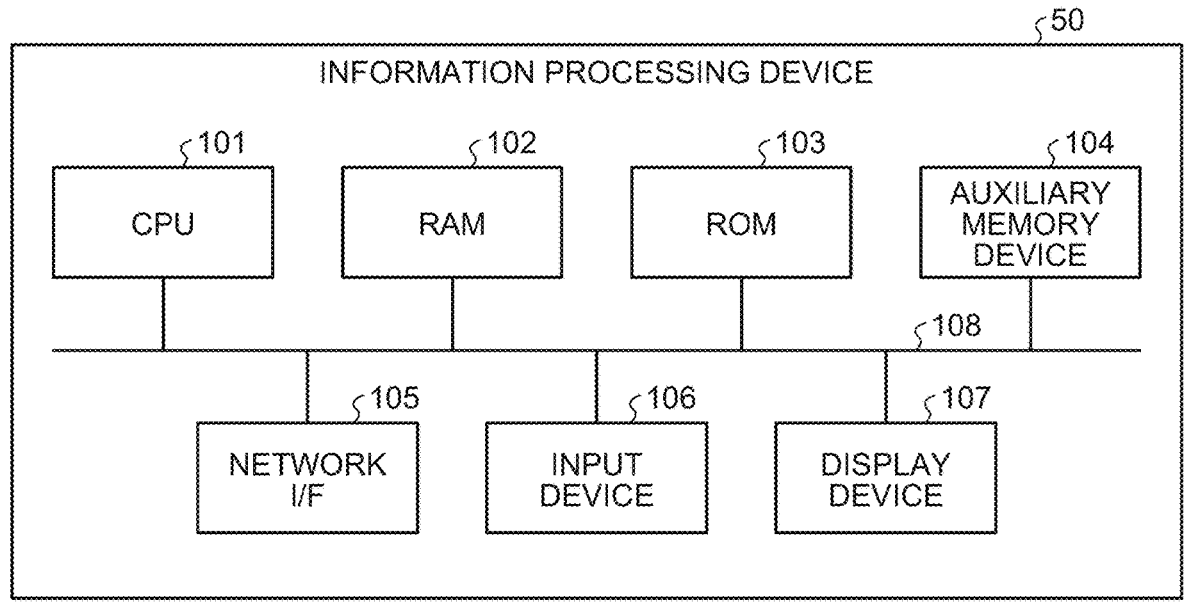
FIG. 3 is a diagram illustrating an exemplary hardware configuration of an information processing device.

FIG. 3 is a diagram illustrating an exemplary hardware configuration of the information processing device 50. Thus, explained with reference to FIG. 3 is a hardware configuration of the information processing device 50.

As illustrated in FIG. 3, the information processing device 50 includes a central processing unit (CPU) 101, a random access memory (RAM) 102, a read only memory (ROM) 103, an auxiliary memory device 104, a network interface (I/F) 105, an input device 106, and a display device 107. Moreover, these constituent elements are connected to each other by a bus 108.

The CPU 101 is an arithmetic device that controls the overall operations of the information processing device 50 and performs a variety of information processing. The CPU 101 executes an information display program stored in the ROM 103 or the auxiliary memory device 104, and controls the display operation for displaying a measurement/collection screen and an analysis screen.

The RAM 102 is a volatile memory device that is used as the work area of the CPU 101, and that is used to store major control parameters and information. The ROM 103 is a nonvolatile memory device that is used to store basic input-output programs. For example, the abovementioned information display program can be stored in the ROM 103.

The auxiliary memory device 104 is a memory device such as a hard disk drive (HDD) or a solid state drive (SSD). For example, the auxiliary memory device 104 is used to store control programs meant for controlling the operations of the information processing device 50, and to store a variety of data and files necessary for the operations of the information processing device 50.

The network I/F 105 is a communication interface that enables communication with devices, such as the server 40, installed in a network. For example, the network I/F 105 is implemented using a TCP/IP-compatible NIC (TCP/IP stands for Transmission Control Protocol/Internet Protocol, and NIC stands for Network Interface Card).

The input device 106 is a user interface such as the input function of a touch-sensitive panel, a keyboard, a mouse, or operation buttons. The display device 107 is a display device for displaying a variety of information. For example, the display device 107 is implemented using the display function of a touch-sensitive panel, or using a liquid crystal display (LCD), or using an organic electroluminescence (EL) display. The display device 107 is used to display the measurement/collection screen and the analysis screen, and the screens are updated according to the input-output operations performed via the input device 106.

Meanwhile, the hardware configuration of the information processing device 50 as illustrated in FIG. 3 is only exemplary, and the information processing device 50 can also include other devices. Moreover, for example, the information processing device 50 illustrated in FIG. 3 has a hardware configuration of a personal computer. However, that is not the only possible case. Alternatively, a mobile terminal such as a tablet can also be used as the information processing device 50. In that case, the network I/F 105 can be a communication interface having the wireless communication function.

Functional Block Configuration of Information Processing Device

Figure 4:
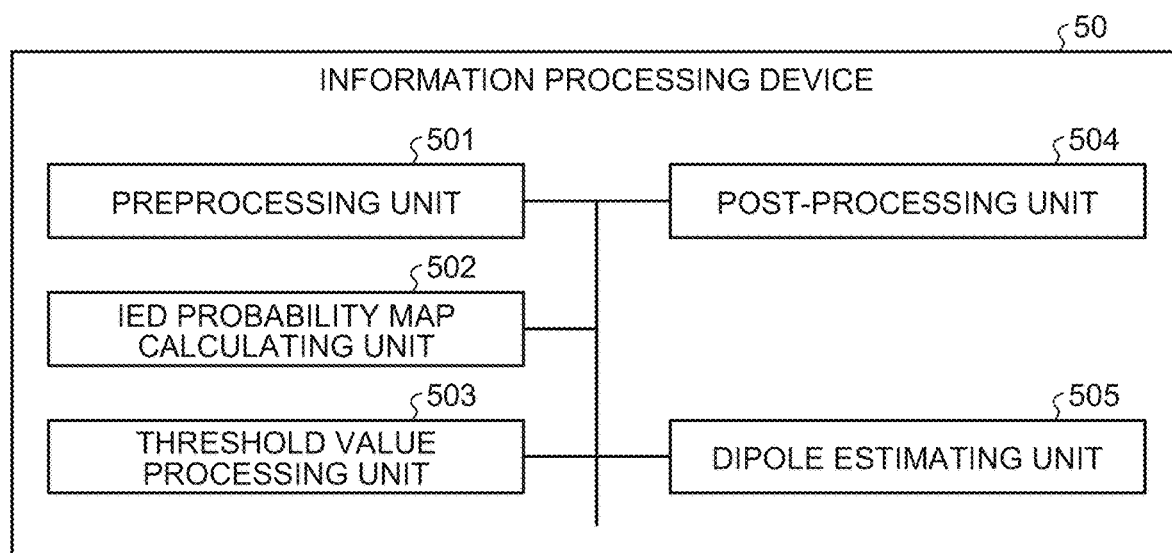
FIG. 4 is a diagram illustrating an exemplary functional block configuration of the information processing device.

FIG. 4 is a diagram illustrating an exemplary functional block configuration of the information processing device 50. Thus, explained with reference to FIG. 4 is a functional block configuration of the information processing device 50.

As illustrated in FIG. 4, the information processing device 50 includes a preprocessing unit 501, an IED probability map calculating unit 502, a threshold value processing unit 503, a post-processing unit 504, and a dipole estimating unit 505.

The preprocessing unit 501 performs preprocessing such as extraction/expansion of sensors, application of downsampling and frequency filtering, artifact removal, defective channel processing, time window clipping, and standardization of magnetic field data.

Regarding the extraction/expansion of sensors, at the time of calculating an IED probability map (described later), apart from using the method of calculating the extraction/expansion of sensors with the use of all sensors, the extraction/expansion of sensors can be calculated using only a certain number of groups of sensors formed in advance. As far as the grouping of sensors is concerned, it is possible to think of the setting that is done in line with the anatomical standards such as the temporal lobe and the frontal lobe, or it is possible to think of grouping a plurality of arbitrary sensors that are simply close to each other. Moreover, in a learning process (described later), if the number of sensors used in the calculation is smaller than the number of used sensors, it is also possible to increase the sensor count with imaginary sensors.

The downsampling is applied with the aim of matching to the sampling frequency used at the time of learning. The same is the case about a frequency filter, and the applied filtering is same as the filtering applied at the time of learning. The commonly used filters include a lowpass filter of 35 Hz and a bandpass filter in the range of 3 Hz to 35 Hz.

In the artifact removal, the ICA (refer to E. Javier, H. Roberto, A. Daniel, F. Alberto, and L. C. Miguel, "Artifact removal in magnetoencephalogram background activity with independent component analysis," IEEE Trans Biomed Eng, Vol. 54, no. 11, pp. 1965-1973, 2007) and the DSSP (refer to K. Sekihara, Y. Kawabata, S. Ushio, S. Sumiya, S. Kawabata, Y. Adachi, and S. S. Nagarajan, "Dual signal subspace projection (DSSP): a novel algorithm for removing large interference in biomagnetic measurements," Journal of Neural Engineering, vol. 13, no. 3, p. 036007, 2016) is applied with the aim of eliminating the cardioballistic artifact or the artifact attributed to blinking/body motion.

The defective channel processing implies excluding the sensors in which the magnetic field variation is observed to exceed a preset threshold value, and performing interpolation using the surrounding sensor values.

As far as the time window clipping is concerned, there are methods such as a method in which only the portion equivalent to the length of the time window is shifted without any overlapping; a method in which half of the length of the time window is overlapped; and a method in which a quarter of the length of the time window is overlapped. In the case of overlapping the length of the time window, an arithmetic mean of the overlapping portion is taken at the time of calculating an IED probability map (described later).

As far as the standardization of magnetic field data is concerned, standardization is applied by which the average of "0" and the dispersion of "1" is achieved in the clipped time window. Other than performing such standardization, it is also possible to implement a method of normalizing the preset range of the magnetic field in such a way that the range from −1 to 1 is achieved.

The IED probability map calculating unit 502 calculates a probability map of the characteristic waveforms (IED: Interictal Epileptiform Discharge).

The IED implies a waveform such as a spike wave, a spike and wave, a poly spike and wave, and a sharp wave. In the present embodiment, the IED probability map calculating unit 502 calculates a probability map using a machine learning model having learned in advance. Regarding the method for creating a machine learning model, the explanation is given later.

The threshold value processing unit 503 uses a threshold value and, from the IED probability map obtained by the IED probability map calculating unit 502, narrows down the time period and the sensor area having a high IED probability.

The post-processing unit 504 performs post-processing for extracting the sampling time points and the sensors, which are to be used in dipole estimation, from the IED probability map that has been subjected to threshold value processing by the threshold value processing unit 503. Moreover, in the case of using a peak detection method or in the case in which a map has a plurality of peaks (the case seen when there are two sites of lesion), the post-processing unit 504 performs post-processing for map separation.

The dipole estimating unit 505 performs dipole estimation (refer to M. Scherg, "Fundamentals of dipole source potential analysis" in Auditory Evoked Magnetic Fields and Potentials, M. Hoke, F. Grandori, and G. L. Romani, Eds. Basel, Switzerland: Karger, 1989, vol. 6) using the sensors and using the sampling time points of the IED origin as obtained in the processing at the prior stage of the dipole estimating unit 505.

Given below is the explanation of a flow of the dipole estimation operation.

Figure 5:
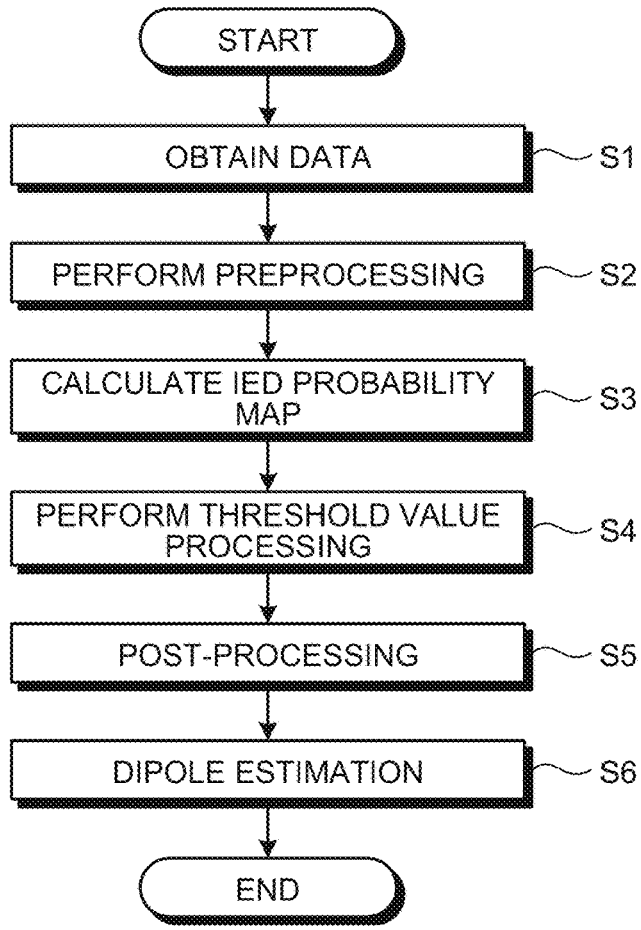
FIG. 5 is a flowchart for explaining the flow of a dipole estimation operation.

FIG. 5 is a flowchart for explaining the flow of the dipole estimation operation. Prior to performing the operations, the measurement device 3 performs magneto-encephalograph measurement and outputs, to the server 40, individual waveform data measured by a plurality of magnetic sensors of the Dewar flask 31. The server 40 stores, in the data storing unit 42, the individual waveform data measured by a plurality of magnetic sensors of the Dewar flask 31 of the measurement device 3.

Then, as illustrated in FIG. 5, firstly, from the data storing unit 42 of the server 40, the preprocessing unit 501 obtains the individual waveform data measured by a plurality of magnetic sensors of the Dewar flask 31 of the measurement device 3 (Step S1).

Then, with respect to the obtained data, the preprocessing unit 501 performs preprocessing such as extraction/expansion of sensors, application of downsampling and frequency filtering, artifact removal, defective channel processing, time window clipping, and standardization of magnetic field data (Step S2).

Subsequently, the IED probability map calculating unit 502 calculates a probability map of the characteristic waveforms (IED) (Step S3).

As far as the calculation of an IED probability map is concerned, other than implementing the method in which the model calculated using the machine learning is applied, it is also possible to use the conventional spike position detection algorithm (refer to Ossadtchi, S. Baillet, J. Mosher, D. Thyerlei, W. Sutherlink, and R. Leahy, "Automated interictal spike detection and source localization in magnetoencephalography using independent components analysis and spatio-temporal clustering," Clinical Neurophysiology, vol. 115, no. 3, pp. 508-522, 2004.). In the case of using machine learning, the points in time of the LEDs that are manually detected by the doctor are learned as the correct answer. Hence, in comparison to the conventional spike position detection method, it becomes possible to obtain a similar result to the case in which the doctor performs the analysis. The conventional method is developed with the aim of detecting the origin of the IED or the peak of the IED. However, in the actual analysis, the doctor performs the analysis while adjusting the time when performing dipole estimation in between the origin and the peak by referring to the waveforms and the observations.

Given below is the explanation about the case in which the IED probability map calculating unit 502 uses machine learning in generating an IED probability map.

Figure 6:
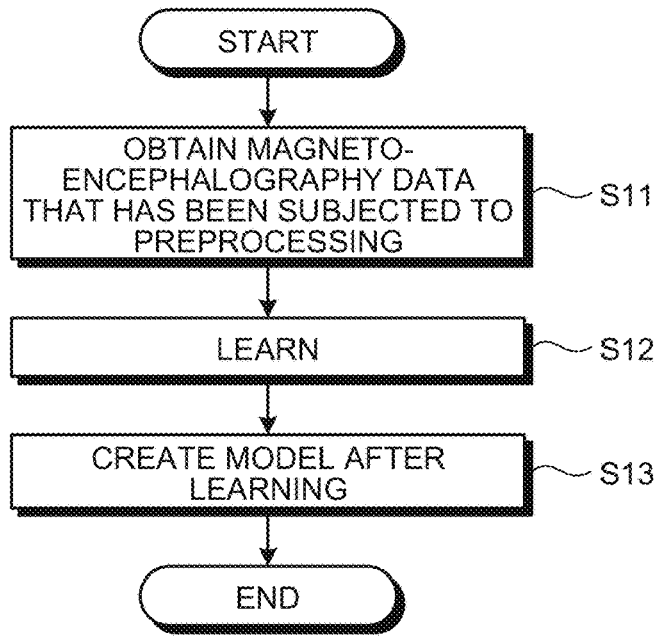
FIG. 6 is a flowchart for explaining the flow of machine learning performed at the time of generating an IED probability map using machine learning.

FIG. 6 is a flowchart for explaining the flow of machine learning performed at the time of generating an IED probability map using machine learning. As illustrated in FIG. 6, the IED probability map calculating unit 502 obtains magneto-encephalography data that has been subjected to preprocessing by the preprocessing unit 501 (Step S11), and then learns the preprocessed magneto-encephalography data for the purpose of outputting an IED probability map (Step S12). Meanwhile, as the correct answer data to be used in the learning, the sampling time points recorded at the time of performing dipole estimation are used along with the information about the sensors used in dipole estimation.

More particularly, the abovementioned operation is implemented by applying a network that is often used in a task called semantic segmentation represented by U-Net mentioned in the following: O. Ronneberger P. Fischer and T. Brox "U-net: Convolutional networks for biomedical image segmentation, "Proc. Int. Conf. Medical Image Comput. Comput.-Assisted Intervention, pp. 234-241 2015. The semantic segmentation implies the task of labelling each element of the entire sequence representing the input. In a medical image, semantic segmentation is used at the time of automatic estimation of a brain tumor or a cancer region. Herein, the sensors selected by the doctor at the time of performing dipole estimation and the mask data created from the time when estimation is performed are treated as the correct answer, and the learning is performed in such a way that the input magneto-encephalography data becomes the mask data. At that time, with the aim of enhancing the generalization capability, it is possible to implement data expansion methods such as randomly changing the sequence of the sensors and setting the value of a particular range of a particular sensor to "0".

Alternatively, the abovementioned operation can be implemented in an identical manner in a network that is used in other tasks, such as object detection and instance segmentation, other than semantic segmentation. The task of object detection represents a method of estimating the position of the target object in the input sequence using a rectangle. In the case of using that method, although an IED probability map cannot be calculated; it is possible to directly obtain, from the detected rectangle, the time when performing dipole estimation (for example, the center of the rectangle) and the sensors to be used in dipole estimation. The task of instance segmentation has a mix of semantic segmentation and object detection. In the task of instance segmentation, in addition to enabling calculation of the classification and the count of the detected objects, the regions of those objects can also be calculated. Herein, the task of instance segmentation is applicable without modification because an IED probability map can be calculated.

Once the learning at Step S2 is finished, the IED probability map calculating unit 502 creates a model after learning (Step S13). This model after learning is used at the time of performing IED detection with respect to the inference of machine learning, that is, with respect to the unknown data.

Given below is the explanation of an IED probability map as calculated by the IED probability map calculating unit 502.

Figure 7:
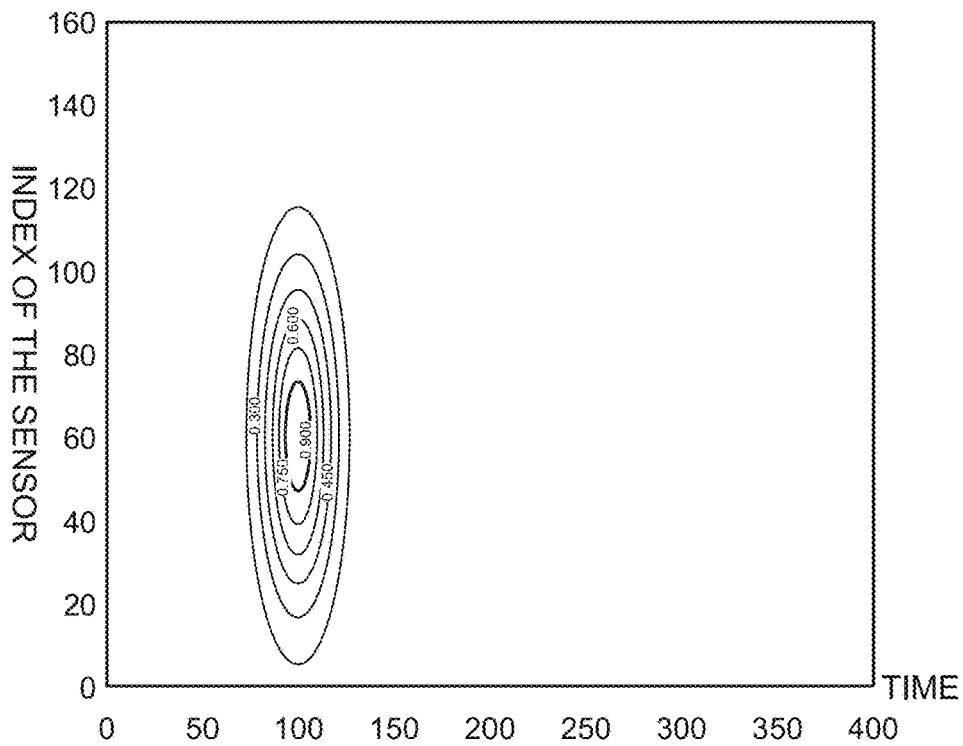
FIG. 7 is a diagram illustrating an example of an IED probability map.

FIG. 7 is a diagram illustrating an example of an IED probability map. In FIG. 7, the horizontal axis represents the time, and the vertical axis represents the index of the sensor. In the example illustrated in FIG. 7, it is estimated that the IED is generated when the index of the time is equal to 100 and the index of the sensor is in between 40 and 80. Meanwhile, in FIG. 7, although the map is expressed in shading of black and white colors, it is also possible to perform a color display in which the color changes according to the probability of the IED.

Returning to the explanation with reference to FIG. 5, subsequently, the threshold value processing unit 503 performs threshold value processing with respect to the IED probability map obtained by the IED probability map calculating unit 502 (Step S4). More particularly, the threshold value processing unit 503 uses a threshold value and, from the IED probability map obtained by the IED probability map calculating unit 502, narrows down the time period and the sensor area having a high IED probability.

Meanwhile, in the threshold value processing unit 503, higher the threshold value, the greater is the possibility of selecting only the waveforms appearing more like the IED. However, that leads to a decrease in the number of IEDs to be used in dipole estimation. On the other hand, in the threshold value processing unit 503, if a lower threshold value is set, although there is an increase in false detection, a higher number of IEDs can be detected. Moreover, since the data of magneto-encephalography is significantly affected by the individual differences, there is a possibility that the IED can hardly be detected unless the threshold value is lowered.

In that regard, the threshold value processing unit 503 can be configured to coordinate with the user interface (UI) and control the number of IEDs detected in an interactive manner.

The threshold value processing unit 503 basically uses a preset value such as "0.8" as the threshold value.

Figure 8:
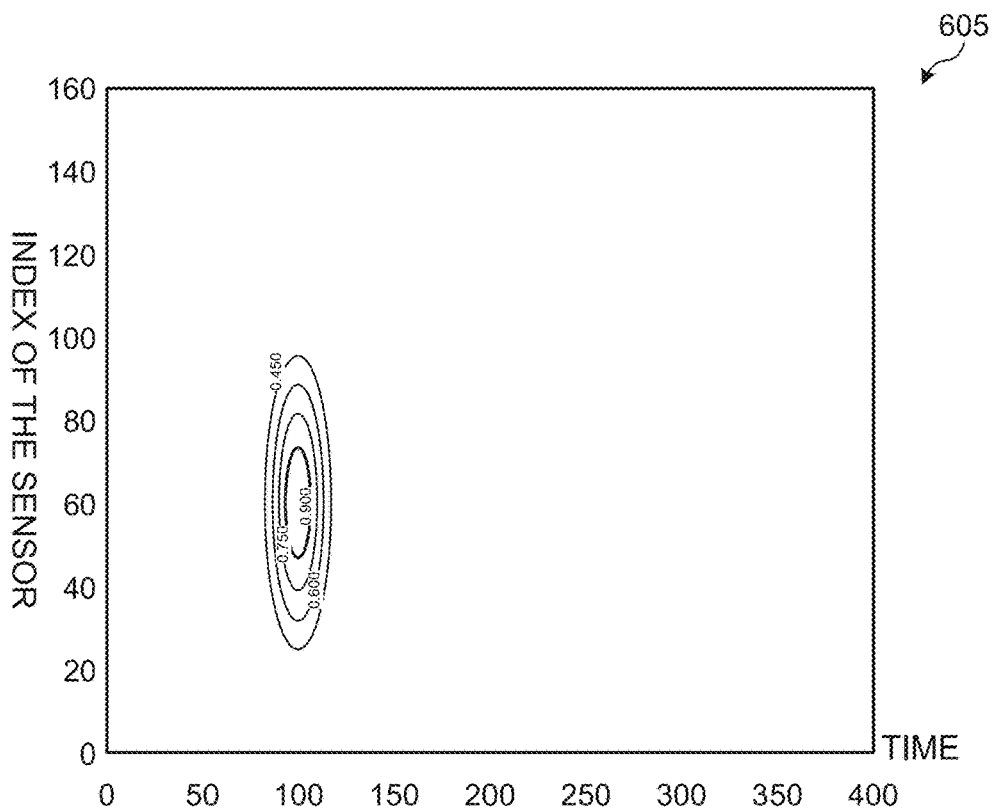
FIG. 8 is a diagram illustrating an example of the IED probability map obtained after the threshold value processing.

Herein, FIG. 8 is a diagram illustrating an example of the IED probability map obtained after the threshold value processing. In the example illustrated in FIG. 8, the threshold value processing unit 503 uses "0.5" as the threshold value. In an IED probability map 605 representing a two-dimensional map illustrated in FIG. 8, it is equivalent to extracting the places at which the IED is generated at a probability of 50% or more.

Returning to the explanation with reference to FIG. 5, subsequently, the post-processing unit 504 performs post-processing for extracting the sampling time points and the sensors, which are to be used in dipole estimation, from the IED probability map 605 that has been subjected to threshold value processing by the threshold value processing unit 503 (Step S5).

More particularly, when the threshold value processing unit 503 is applied, the time and the sensor area having the probability equal to or greater than a predetermined value are extracted. Moreover, with the aim of performing peak detection or clarifying the point of time of IED detection, a filter such as a Gaussian filter can be applied with respect to the extracted sensor area before performing peak detection. As a result of performing peak detection only after applying a filter such as a Gaussian filter with respect to the extracted sensor area, the point of time of the IED is determined. Herein, peak detection can be performed with respect to a one-dimensional probability map obtained by taking an arithmetic mean of the probability maps including the extracted sensor area in the sensor direction. When the arithmetic mean is not taken, peak detection can be performed on a sensor-by-sensor basis, and the time of the IED can be determined by taking an average of those points of time.

The threshold value processing unit 503 extracts, as the sensors to be used in dipole estimation, the sensors having the probability to be equal to or greater than a predetermined value at the point of time of the detected peak. It is a known fact that, if only a small number of sensors are used in dipole estimation, the stability of the dipole estimation answer decrease. For that reason, if the selected number of sensors is not up to the specified count, then it is also possible to not perform dipole estimation at the point of time of that particular IED.

As another sensor extraction method, a group of sensors can be defined in advance, and the extracted sensors can be expanded to all sensors in the groups to which the extracted sensors belong, so that the stability of the dipole estimation answer can be enhanced. Herein, although a group is fundamentally set with reference to the anatomical standards such as the vicinity of the temporal lobe or the vicinity of the frontal lobe, it is also possible to simply treat an arbitrary number of neighborhood regions as a single group.

Figure 12A:
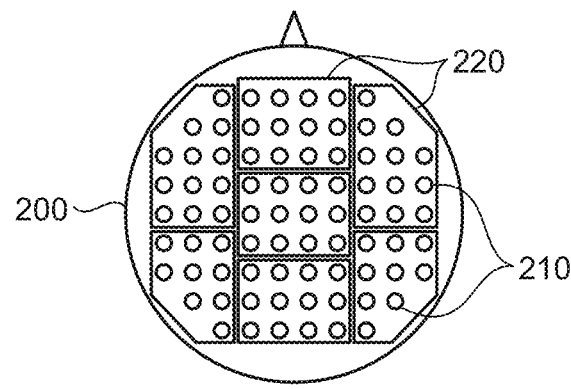
FIGS. 12A to 12C are conceptual diagrams illustrating an example of a sensor expansion method.
Figure 12B:
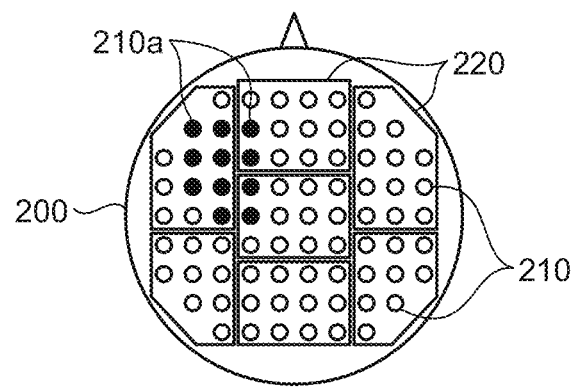
Figure 12C:
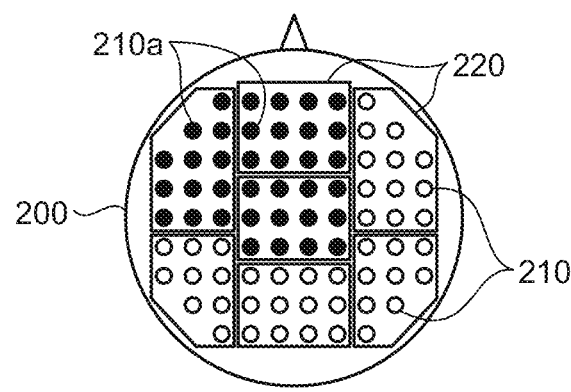

FIGS. 12A to 12C are conceptual diagrams illustrating an example of the sensor expansion method. In FIG. 12A, a head region 200 of the subject being tested is illustrated along with illustrating magneto-encephalography sensors 210 arranged to cover the head region 200 and illustrating preset groups 220 of the sensors 210. In FIG. 12B, sensors 210a illustrated with filled circles represent the sensors extracted after the threshold value processing. Although dipole estimation can be performed using only the sensors 210a that are extracted after the threshold value processing; as explained above, in order to enhance the stability of the dipole estimation answer, it is also possible to perform sensor expansion. In FIG. 12C is illustrated the result of expanding the number of sensors. That is, as illustrated in FIG. 12C, the sensors 210a that are extracted after the threshold value processing are expanded to all sensors 210 of the groups 220 to which the extracted sensors 210a belong. That enables achieving enhancement in the stability of the dipole estimation answer.

Meanwhile, if the IED probability map has a plurality of peaks (the case seen when there are two sites of lesion), the post-processing unit 504 can perform post-processing (described later) for map separation.

As another example of setting the neighborhood regions, a convex hull can be configured from the selected sensor configuration; the space can be expanded by performing morphological transformation of the convex hull with a predetermined threshold value; and the sensors included in the expanded space can be treated as a single group.

Meanwhile, the sensors can be obtained in sequential manner starting from the nearest neighbor point with reference to the midpoint of the spatial coordinates of the sensor having the maximum value (gushing out) of the magnetic field of the selected sensor data and the spatial coordinates of the sensor having the minimum value (sucking in) of the magnetic field of the selected sensor data.

Moreover, from the magnetic field information obtained from the sensor data, a spatial equivalent magnetic field map can be reconfigured with a predetermined magnetic field threshold value; and, from the magnetic field information of the selected sensors, such sensors can be selected which are in the vicinity of the magnetic field information of the already-selected sensors and which belong to the same equivalent magnetic field line.

Furthermore, the groups can be configured by combining a determining method using the spatial distribution of the magnetic field of the neighborhood regions with the anatomical standard. With that, sensor groups can be configured from the spatial and anatomical perspectives.

Lastly, the dipole estimating unit 505 performs dipole estimation (refer to M. Scherg, "Fundamentals of dipole source potential analysis" in Auditory Evoked Magnetic Fields and Potentials, M. Hoke, F. Grandori, and G. L. Romani, Eds. Basel, Switzerland: Karger, 1989, vol. 6) using the sensors used in the processing at the prior stage of the dipole estimating unit 505 and using the sampling time point of the origin of the IED (Step S6). Herein, apart from performing dipole estimation, it is also possible to substitute dipole estimation with a current source analysis method using a spatial filtering method such as the minimum norm method (refer to K. Sekihara, M. Sahani, and S. S. Nagarajan, "Localization bias and spatial resolution of adaptive and non-adaptive spatial filters for MEG source reconstruction, "NeuroImage, vol. 25, no. 4, pp. 1056-1067, 2005) or the LCMV Beamformer method (refer to B. V. Veen, W. V. Drongelen, M. Yutchman, and A. Suzuki, "Localization of brain electrical activity via linearly constrained minimum variance spatial filtering," IEEE transactions on Biomedical Engineering, vol. 44, no. 9, pp. 867-880, 1997). The spatial filtering method is a method in which about a few tens of thousands of dipoles can be arranged inside the brain in advance, and the temporal changes in the current in each dipole can be obtained.

Figure 9A:
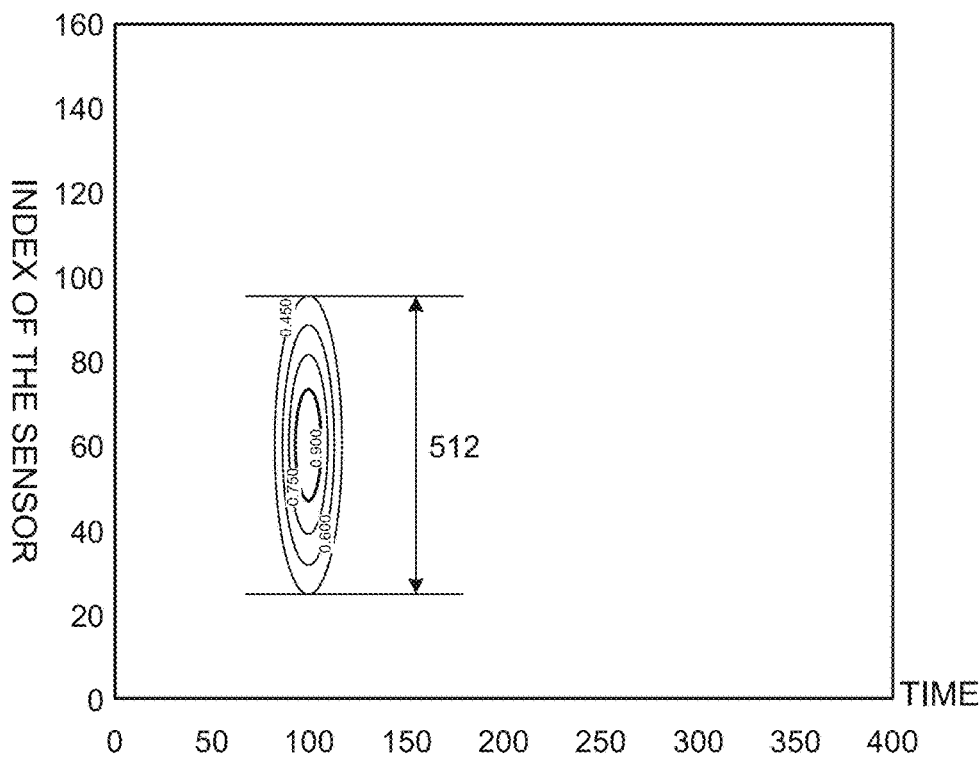
FIGS. 9A and 9B are diagrams illustrating an example of the IED probability map obtained after the post-processing.
Figure 9B:
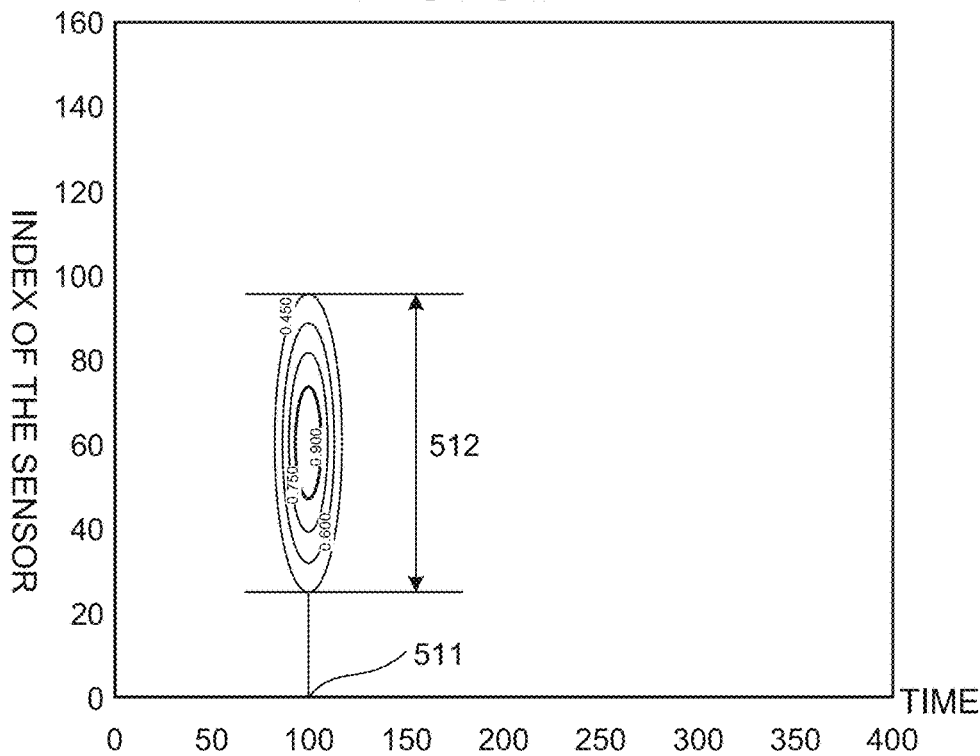

FIGS. 9A and 9B are diagrams illustrating an example of the IED probability map obtained after the post-processing. The post-processing unit 504 performs peak detection and threshold value processing with respect to the post-threshold-value-processing IED probability map as obtained in FIG. 8, and extracts the sampling time points and the sensors for dipole estimation. In the example illustrated in FIGS. 9A and 9B, the post-processing unit 504 performs peak detection and threshold value processing, and obtains a sampling time point 511 of the specified dipole estimation and a channel 512 in which the sensors are extracted.

The dipole estimating unit 505 performs dipole estimation using the sampling time point 511 for dipole estimation and using the channel 512 in which the sensors are extracted.

Meanwhile, in the example illustrated in FIGS. 9A and 9B, the simulated case has only one spike. However, when there are two or more spikes, the post-processing unit 504 can be configured to separate the maps using a watershed algorithm (refer to J. Cousty, G. Bertrand, L. Najman, and M. Couprie, "Watershed Cuts: Minimum Spanning Forests and the Drop of Water Principle," IEEE Transactions on Pattern Analysis and Machine Intelligence, vol. 31, no. 8, pp. 1362-1374, 2009.) or a random walk segmentation algorithm (refer to L. Gardy, "Random Walks for Image Segmentation," IEEE Transactions on Pattern Analysis and Machine Intelligence, vol. 28, no. 11, pp. 1768-1783, 2006.); so that dipole estimation can be performed with respect to only a single IED.

Figure 10:
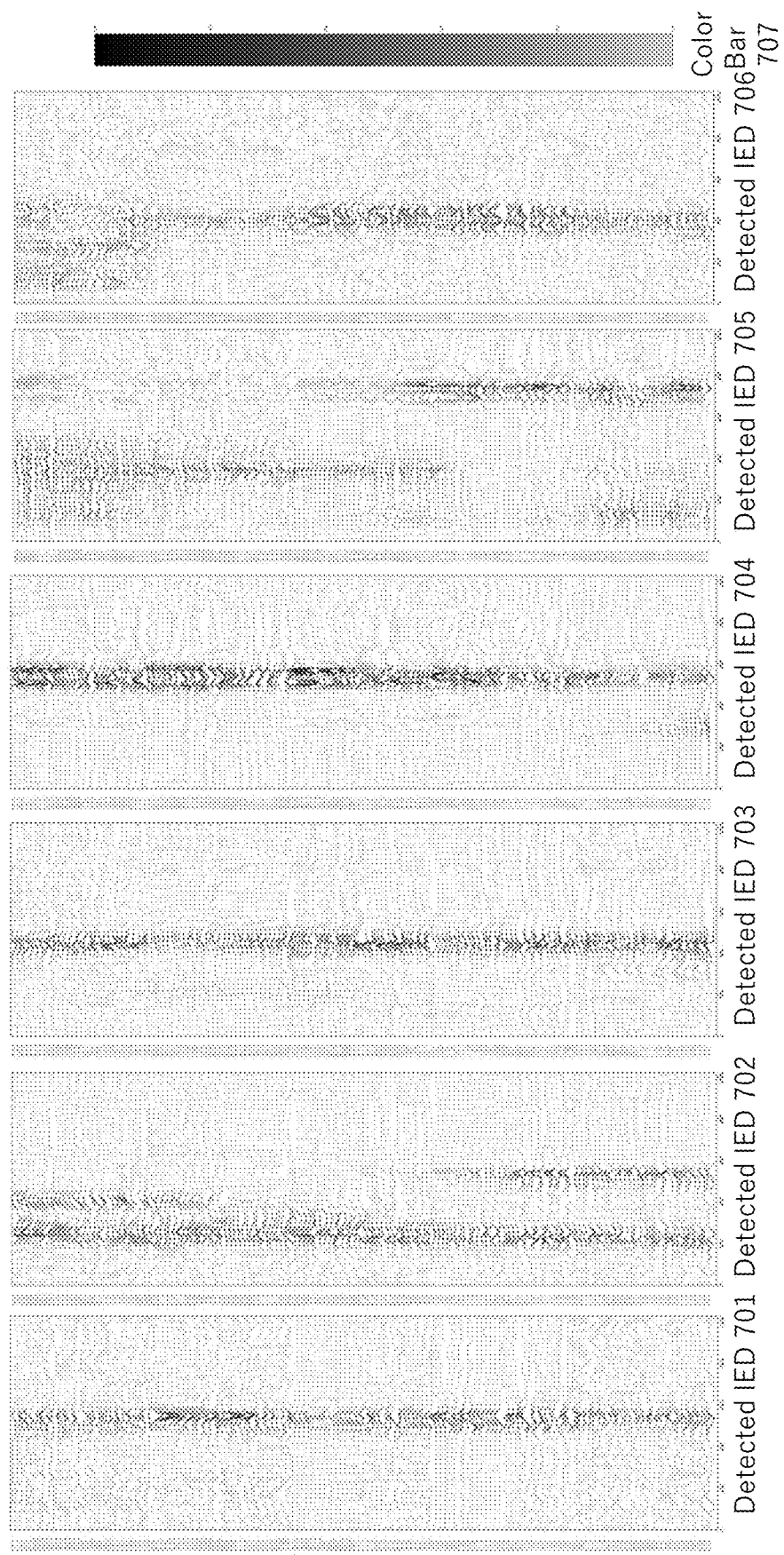
FIG. 10 is a diagram illustrating an example of a user interface (UI) in which an IED probability map is used.

FIG. 10 is a diagram illustrating an example of a UI in which an IED probability map is used. As illustrated in FIG. 10, an IED probability map representing a two-dimensional map calculated in the manner explained above can be superimposed on the original waveforms, so that it becomes possible to overview the points of the waveforms on which the network after learning have focused. As a result, it becomes possible to exclude the data having an adverse effect on the estimation result, such as false detection having an adverse effect on the diagnosis of the localization of the estimated epilepsy lesion. At the time of display, although all sensors can be displayed without modification, it is also possible to display only the manually-selected sensors or to display the sensors in preset units of sensor groups.

As a result of performing such display, the estimation result can be compared with the original waveforms, and the selection of the point of time of the IED and the selection of the sensors can be performed with more accuracy. Hence, it becomes possible to make a more accurate diagnosis of the localization of the epilepsy lesion.

Meanwhile, in the example illustrated in FIG. 10, the drawing is such that the shading changes according to the estimated probability. Alternatively, it is also possible to set a color map according to the probability. For example, a color map of linear color variation can be used in which the color is black at the probability of "0", changes from blue to red as the probability increases, and is white at the probability of "1".

Particularly, by the IED probability map calculating unit 502 learning using, as the correct answer data, the point of time of the IED, and the narrowed-down sensors that are ideal in the equivalent current dipole method, at the time of performing machine learning, dipole estimation of high accuracy can be achieved. In the example illustrated in FIG. 10, using machine learning, the IED origin of epilepsy and the sensors at which that IED is generated are extracted. In FIG. 10, the places expressed in dark shading represent the places estimated by machine learning.

Meanwhile, although the explanation given above is about a magneto-encephalograph, that is not the only possible case. That is, the present invention can be applied to an electro-encephalograph too.

In this way, according to the present embodiment, as a result of using an IED probability map, it becomes possible to detect the time of the origin of the IED and to select the sensors as required in the equivalent current dipole method. That enables determining the time when the characteristic waveform information (IED) appears and enables selecting the sensors in a more accurate manner. Hence, it becomes possible to perform localization diagnosis of the epilepsy lesion using the equivalent current dipole method.

Moreover, as a result of implementing an automatic IED search method using machine learning, it becomes possible to automate execution of the search for the IED and determination of the origin.

Given below is the explanation in the case in which the IED probability map calculating unit 502 uses a method other than machine learning at the time of generating an IED probability map.

Figure 11:
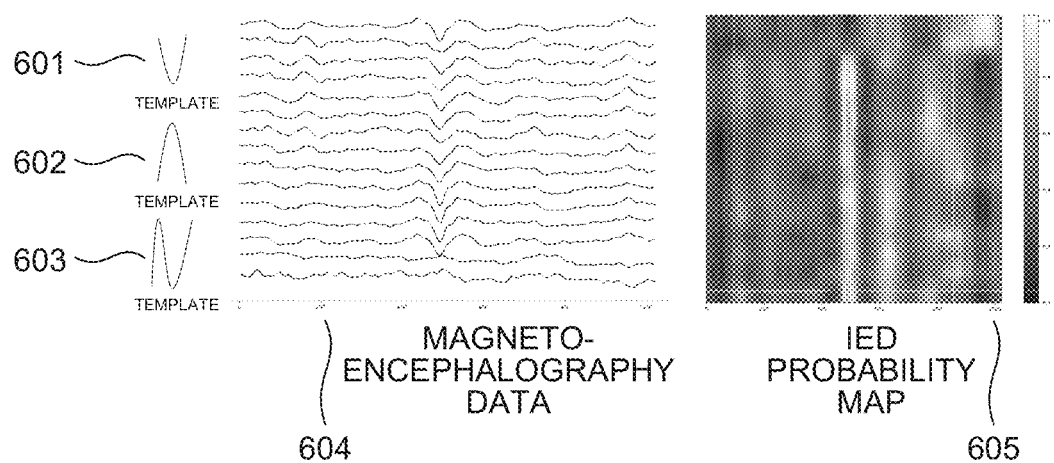
FIG. 11 is a diagram illustrating an example of calculating an IED probability map using a method other than machine learning.

FIG. 11 is a diagram illustrating an example of calculating an IED probability map using a method other than machine learning. In the example illustrated in FIG. 11, the IED probability map calculating unit 502 uses template matching. The IED probability map calculating unit 502 performs IED detection using a template for generalizing the shapes of the IED, which are created according to a literature in which the morphological features of the IED in magneto-encephalography are studied (refer to R. Nowak, M. Santiuste, and A. Russi, "Toward a definition of MEG spike: Parametric description of spikes recorded simultaneously by MEG and depth electrodes", Seizure, vol. 18, no. 9, pp. 652-655, 2009.).

As illustrated in FIG. 11, with respect to the temporal sequence of the magneto-encephalography data of one sensor from among magneto-encephalograph data 604, the IED probability map calculating unit 502 scans templates 601 to 603; and, depending on the degree of similarity, creates the IED probability map 605 representing a two-dimensional map. Although the created map is not a probability map in a precise sense, it can still be used as a map for the concerned purpose. Hence, as a matter of convenience, the map is treated as a probability map.

In the calculation of the degree of similarity, the calculation can be performed using a method obtained by unidimensionalizing a similarity degree calculation method of template matching in images, such as normalized cross-correlation (NCC) or zero-mean normalized cross-correlation); or using a method obtained by simply normalizing the convolution with the filter. As far as the IED detection is concerned, apart from template matching, a few other methods can also be implemented, such as a method in which the IED is derived by detecting a steep transition from the IED baseline.

Meanwhile, when machine learning is not used in the IED probability map calculating unit 502, there is a possibility of getting an unfavorable result of dipole estimation at the peak position. Hence, it becomes necessary to perform post-processing such as shifting the sampling time point to a slightly earlier point of time and then performing dipole estimation.

As a result of implementing an automatic IED search method in which the abovementioned algorithm is used, it becomes possible to automate execution of the search for the IED and to automate determination of the origin.

In the embodiment described above, when at least some of the functional units of the biosignal measurement system 1 are implemented by executing a computer program, that computer program is stored in advance in a ROM. Alternatively, the computer program executed in the biosignal measurement system 1 according to the embodiment described above can be recorded as an installable file or an executable file in a computer-readable recording medium such as a compact disc read only memory (CD-ROM), a flexible disc (FD), a compact disc recordable (CD-R), or a digital versatile disc (DVD).

Still alternatively, the computer program executed in the biosignal measurement system 1 according to the embodiment described above can be stored in a downloadable manner in a computer connected to a network such as the Internet.

Still alternatively, the computer program executed in the biosignal measurement system 1 according to the embodiment described above can be distributed via a network such as the Internet. Meanwhile, the computer program executed in the biosignal measurement system 1 according to the embodiment described above has a modular configuration including at least some of the abovementioned functional units. As far as the actual hardware is concerned, a CPU reads the computer program from the ROM and executes it, so that the functional units are loaded and generated in a main memory device.

According to an aspect of the present invention, it becomes possible to determine the time when characteristic waveform information (IED) appears, and extract the sensor in a more accurate manner.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Further, any of the above-described apparatus, devices or units can be implemented as a hardware apparatus, such as a special-purpose circuit or device, or as a hardware/software combination, such as a processor executing a software program.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, non-volatile memory, semiconductor memory, read-only-memory (ROM), etc.

Alternatively, any one of the above-described and other methods of the present invention may be implemented by an application specific integrated circuit (ASIC), a digital signal processor (DSP) or a field programmable gate array (FPGA), prepared by interconnecting an appropriate network of conventional component circuits or by a combination thereof with one or more conventional general purpose microprocessors or signal processors programmed accordingly.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A waveform generation identification method comprising:
    comparing individual magneto-encephalograph waveform data obtained by each of a plurality of sensors, with at least one piece of characteristic waveform information;
    determining appearance probability of characteristic waveform information in at least a certain section of the waveform data, based on a degree of correlation between a section of the waveform data and the characteristic waveform information; and
    identifying a time when the certain section matching with the characteristic waveform information appears and identifying a concerned sensor from among the plurality of sensors, based on the appearance probability.

2. The waveform generation identification method according to claim 1, wherein the determining includes displaying a two-dimensional map representing the appearance probability of the characteristic waveform information in at least the certain section of the waveform data.

3. The waveform generation identification method according to claim 2, wherein the determining includes displaying the two-dimensional map to be superimposed on the individual waveform data obtained by the plurality of sensors.

4. The waveform generation identification method according to claim 1, wherein the determining includes calculating a probability map of the characteristic waveform information using a machine learning model having learned in advance.

5. The waveform generation identification method according to claim 4, wherein the determining includes causing learning to be performed using, as correct answer data, information about a point of time of characteristic waveform information and one of the plurality of sensors that are ideal in an equivalent current dipole method, in machine learning.

6. The waveform generation identification method according to claim 4, wherein the identifying includes defining groups of sensors in advance, and expanding a number of sensors having probability equal to or greater than a predetermined value in the probability map into all sensors of a group to which the number of sensors belong, to narrow down the plurality of sensors.

7. The waveform generation identification method according to claim 2, wherein the determining includes performing color display of the two-dimensional map in which color changes according to the appearance probability of the characteristic waveform information.

8. A non-transitory computer-readable medium including programmed instructions that cause a computer to execute:
- comparing individual magneto-encephalograph waveform data obtained by each of a plurality of sensors, with at least one piece of characteristic waveform information;
- determining, appearance probability of characteristic waveform information in at least a certain section of the waveform data, based on a degree of correlation between a section of the waveform data and the characteristic waveform information; and
- identifying a time when the certain section matching with the characteristic waveform information appears, and identifying a concerned sensor from among the plurality of sensors, based on the appearance probability.

9. The computer-readable medium according to claim 8, wherein the determining includes displaying a two-dimensional map representing the appearance probability of the characteristic waveform information in at least the certain section of the waveform data.

10. The computer-readable medium according to claim 9, wherein the determining includes displaying the two-dimensional map to be superimposed on individual waveform data obtained by the plurality of sensors.

11. The computer-readable medium according to claim 8, wherein the determining includes calculating a probability map of the characteristic waveform information using a machine learning model having learned in advance.

12. The computer-readable medium according to claim 11, wherein the determining includes causing learning to be performed using, as correct answer data, information about a point of time of characteristic waveform information and one of the plurality of sensors that are ideal in an equivalent current dipole method, in machine learning.

13. The computer-readable medium according to claim 11, wherein the identifying includes defining groups of sensors in advance, and expanding a number of sensors having probability equal to or greater than a predetermined value in the probability map into all sensors of a group to which the number of sensors belong, to narrow down the plurality of sensors.

14. The computer-readable medium according to claim 9, wherein the determining includes performing color display of the two-dimensional map in which color changes according to the appearance probability of the characteristic waveform information.

* * * * *